United States Patent
Kemmochi et al.

(10) Patent No.: US 7,556,764 B2
(45) Date of Patent: Jul. 7, 2009

(54) SILICA VESSEL WITH NOZZLE AND METHOD OF MAKING

(75) Inventors: Katsuhiko Kemmochi, Camas, WA (US); Yasuo Ohama, Fukui (JP)

(73) Assignee: Heraeus Shin-Etsu America, Inc., Camas, WA (US)

(*) Notice: Subject to any disclaimer, the term of this patent is extended or adjusted under 35 U.S.C. 154(b) by 605 days.

(21) Appl. No.: 11/271,491

(22) Filed: Nov. 9, 2005

(65) Prior Publication Data
US 2007/0102133 A1 May 10, 2007

(51) Int. Cl.
*B28B 1/02* (2006.01)
(52) U.S. Cl. .................. 266/44; 266/275; 432/250; 264/30
(58) Field of Classification Search .......... 266/275, 266/44; 432/250; 264/30
See application file for complete search history.

(56) References Cited

U.S. PATENT DOCUMENTS

| | | | |
|---|---|---|---|
| 4,416,680 A | 11/1983 | Brüning et al. | |
| 6,641,663 B2 * | 11/2003 | Kemmochi et al. | 117/200 |
| 7,427,327 B2 * | 9/2008 | Kemmochi et al. | 117/200 |
| 2003/0106491 A1 * | 6/2003 | Kemmochi et al. | 117/200 |
| 2005/0120945 A1 * | 6/2005 | Hansen | 117/15 |

FOREIGN PATENT DOCUMENTS

| | | |
|---|---|---|
| JP | H1-43859 | 12/1989 |
| JP | H11-43318 | 2/1999 |

OTHER PUBLICATIONS

Translation of Japanese Patent Application Publication No. H11-43318.
Translation of Japanese Patent Application Publication No. H1-43859.

* cited by examiner

*Primary Examiner*—Scott Kastler
(74) *Attorney, Agent, or Firm*—Marger Johnson & McCollom, P.C.

(57) ABSTRACT

A fused silica crucible having a nozzle is formed by first inserting a preformed silica glass tube into the lower portion of a graphite mold. The tube is aligned with a vertical axis about which the mold is rotated while silica grain is poured into the mold and shaped in the form of the crucible. A graphite plug inserted into the top of the tube keeps the grain out of the tube. Electrodes create a plasma gas ball that fuses the grain and forms it to the tube. Although the graphite plug is covered with grain, the molten silica recedes from the top of the plug during fusion thus forming the nozzle to the crucible.

7 Claims, 4 Drawing Sheets

SILICA VESSEL WITH NOZZLE AND METHOD OF MAKING

The present invention relates generally to fused silica vessels and more particularly to such vessels that include a nozzle for discharging liquid from the vessel.

BACKGROUND OF THE INVENTION

It is well known to make a vessel with silica grain in a rotating mold. While the mold rotates, grain is formed therein in the shape of a crucible having a uniform wall thickness. A set of electrodes is then lowered into the mold and high voltage is applied to create a plasma gas cloud around the electrodes, which heats the grain and ultimately fuses them into the crucible.

Such crucibles may be used, e.g., to melt metallic silicon, from which a single crystal ingot may be drawn. These ingots are sliced to provide the silicon wafer on which semiconductor circuits are formed. In other applications, fused silica crucibles are used to melt metallic silicon, which is then poured into a mold to create a polycrystalline silicon ingot. Poured ingots are sliced to make solar cells. The crucible must include a nozzle in applications that require pouring.

Prior art nozzles are formed on crucibles by first making the crucible as described above. After the crucible is formed and cooled, a diamond drill is used to drill a hole through a wall thereof, typically in the center of the bottom of the crucible. A preformed quartz glass nozzle is then welded to the crucible over the hole, thus providing a crucible from which liquid may be discharged via the nozzle.

High heat must be applied to the crucible to weld the nozzle to it. This localized high heat creates stress around the nozzle. If the welded structure is not annealed, the vessel may crack. As the thickness of the vessel increases, the risk of cracking does as well. If the thickness exceeds 3 mm or the crucible diameter exceeds 300 mm, the risk of cracking is very high. Annealing the welded structure takes about 10 hours while fusing the crucible in the rotating mold takes only about an hour.

DETAILED DESCRIPTION

Figure 1:
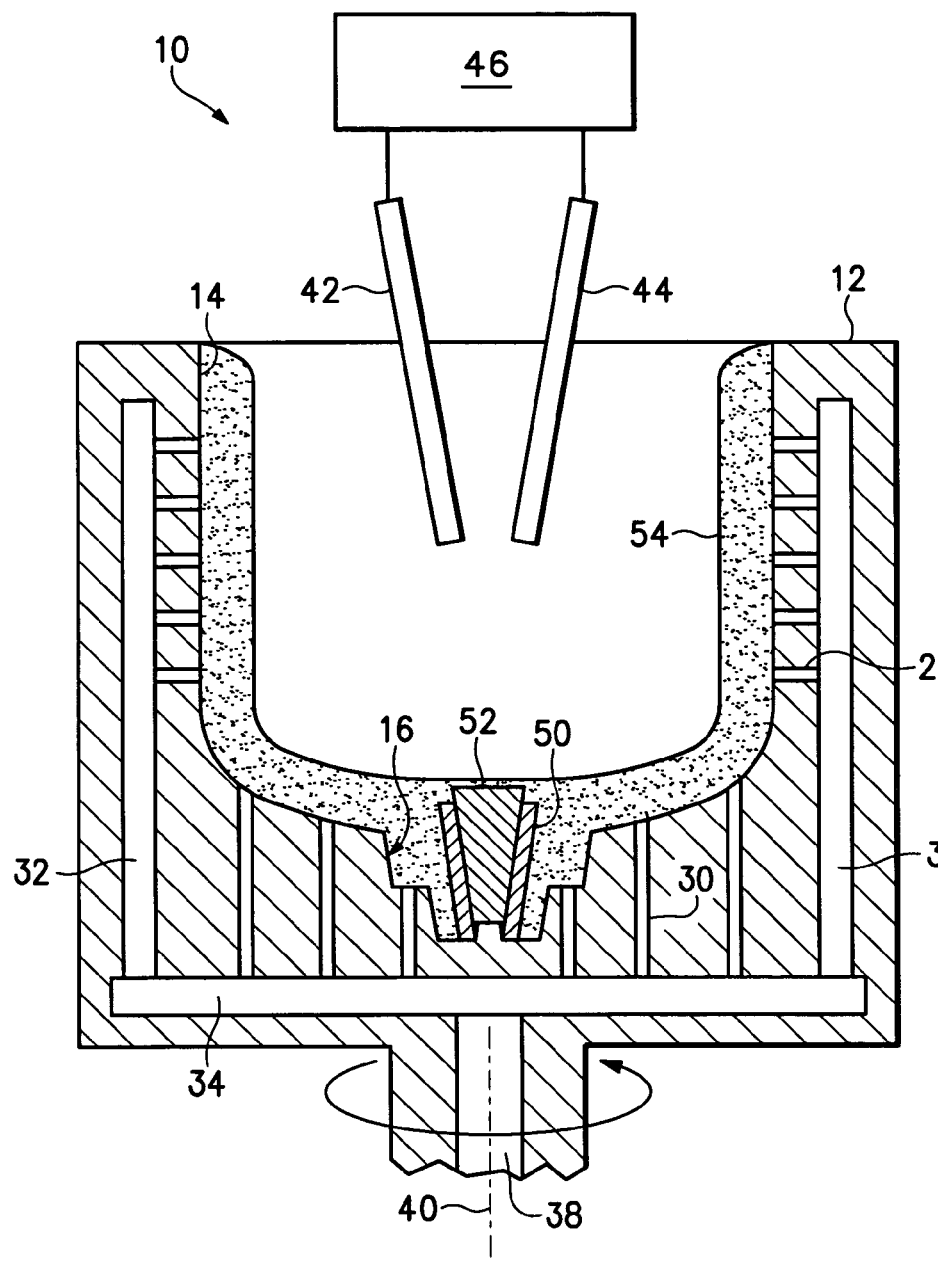
FIG. 1 is a sectional schematic view of a mold having silica grain and a quartz glass tube received therein.

Turning now to the drawings, indicated generally at 10 is system for fusing a silica crucible having a nozzle in accordance with the present invention. The system includes a mold 12 having a generally continuous smooth surface 14. Mold surface 14 includes a recess 16, also referred to herein as a discontinuity. For a more detailed view of recess 16, attention is directed to FIG. 3A.

The recess includes first and second sloped annular wall surfaces 18, 20, respectively. The lower portion of wall surface 18 is connected to the upper portion of wall surface 20 via a substantially horizontal annular floor surface 22. Another substantially horizontal floor surface 24 forms the lowermost portion of recess 16. A stud 26 comprises an upright cylindrical portion that extends upwardly from the lowermost portion of recess 16.

Turning again to FIG. 1, a plurality of air channels, like air channels 28, 30 communicate with inner mold surface 14. Each air channel comprises a cylindrical bore that creates a circular opening (not visible) on mold surface 14. Each air channel includes a porous graphite plug (also not visible) that prevents silica from being drawn from the mold cavity into the air channels. The air channels communicate with manifolds, like manifolds 32, 34, 36, which in turn communicate with a bore 38. A pump (not visible in the drawings) is connected to bore 38. The pump is configured to draw air from the mold cavity via the air channels and ultimately through bore 38 and out of system 10.

Mold 12 may be rotated by a motor (not shown) about a vertical axis 40. A set of conventional electrodes 42, 44 is vertically movable into and out of the mold interior. The electrodes are connected to a conventional DC power supply 46 that can apply power to the electrodes in a selectable range between about 300 KVA and 1200 KVA. When sufficient power is applied to electrodes 42, 44 an extremely hot plasma gas ball 48 (in FIG. 2) forms around the electrodes.

Consideration will now be given to use of system 10 to make a crucible having a nozzle. First, a quartz glass tube 50 is inserted into recess 16. As can be seen in the drawings, tube 50 has a frusto-conical (truncated-cone) exterior shape. Stud 26 is received into the lower end of tube 50, which stabilizes the tube. In the present implementation, tube 50 may be prepared using conventional methods, such as being cut from a block, heat-formed from a pipe, or slip cast—although any technique to make a tube similar to tube 50 may be used.

Figure 3A:
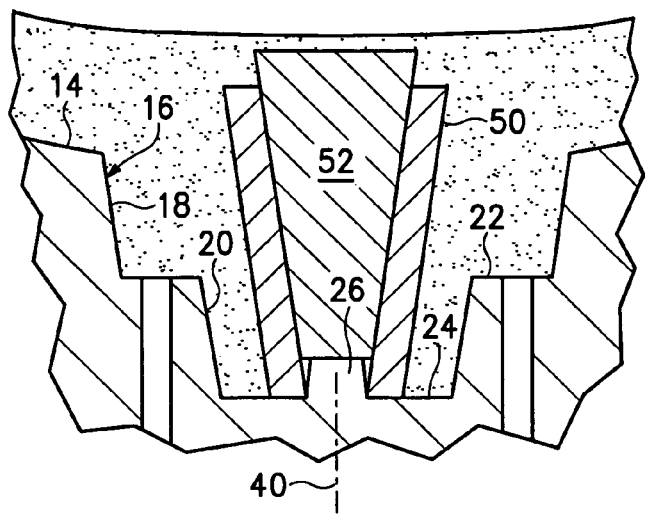
FIG. 3A is an enlarged partial view of the quartz glass tube and surrounding silica grain from FIG. 1.

After the tube is positioned as shown in FIG. 3A, a frusto-conically shaped graphite plug 52 is inserted in the upper end of tube 50. As will be seen, plug 52 keeps quartz grain out of the interior of the tube during fusion. To prevent the plug from contaminating the crucible as it is formed, it is desirable for the plug to have a high purity, preferably less than or equal to 5 ppm ash.

Next, mold 12, along with tube 50 and plug 52, begin rotation about axis 40 while silica grain 54 (FIG. 1) is poured into the mold and formed into a crucible shape, as shown in FIG. 1. Such pouring and shaping is not depicted in the drawings but may be readily accomplished by one having ordinary skill in the art.

Silica grain is added until both tube 50 and plug 52 are covered with grain as shown in FIG. 3A. As will shortly be explained, it is desirable to cover the graphite plug. The depth of silica grain over the plug may be in the range of 1 to 15 mm, but preferably is in the range of 2-6 mm.

Figure 2:
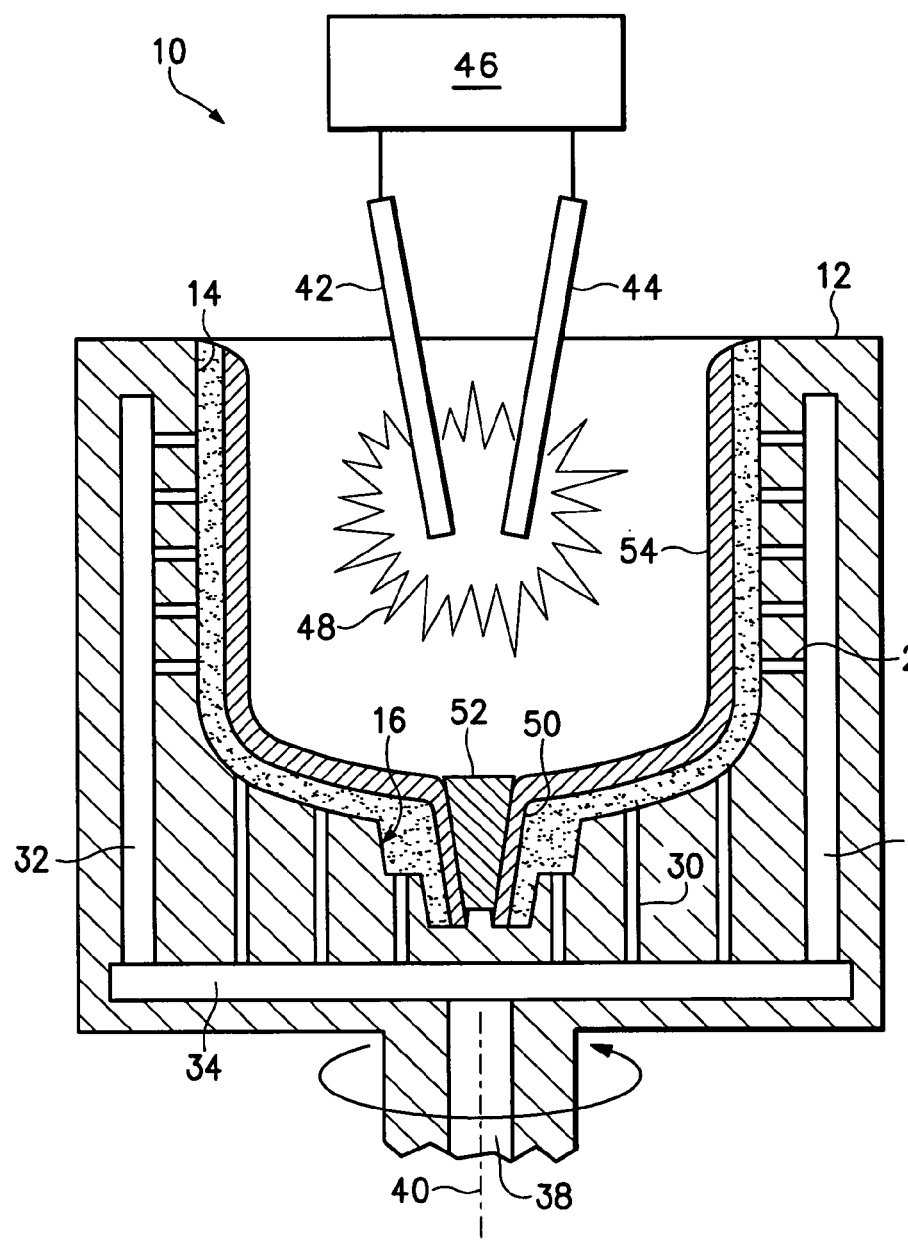
FIG. 2 is a view similar to FIG. 1 near completion of fusing the silica grain.
Figure 3B:
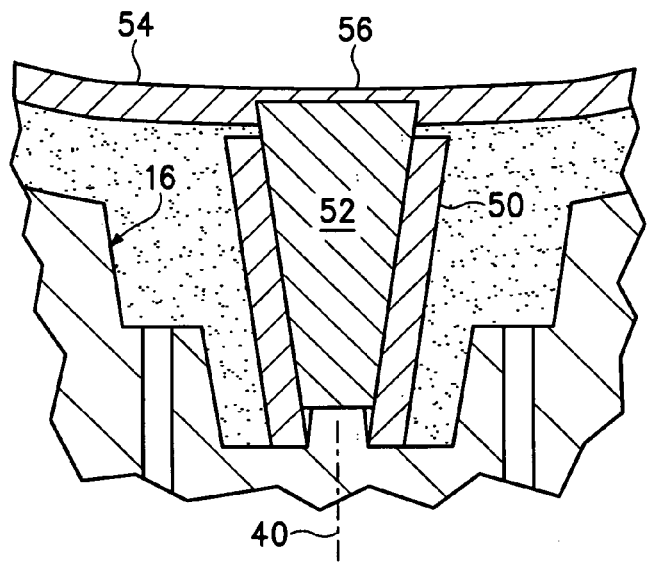
FIG. 3B is the view of FIG. 3A after some silica grain fusion.

Once the system 10 is in the configuration shown in FIG. 1, voltage applied to electrodes 42, 44 creates a plasma gas ball 48, as shown in FIG. 2. This heats the silica grain and begins fusing it starting from its exposed surface toward mold surface 14. In FIG. 3B, after initial heating, a layer of quartz glass 54 forms as a result of fusion of some of the silica grain. Fusion of the grains over plug 52 forms a thin layer of quartz glass 56 over the plug. This layer seals the graphite plug from the plasma gas ball and thus prevents the plug from burning and discharging impurities that might affect the quality of the fused glass around it. This is also why using relatively pure graphite to make the plug is important: the fewer the impurities in the plug, the fewer there are to be discharged into the surrounding grain and glass as heat is applied.

Figure 3C:
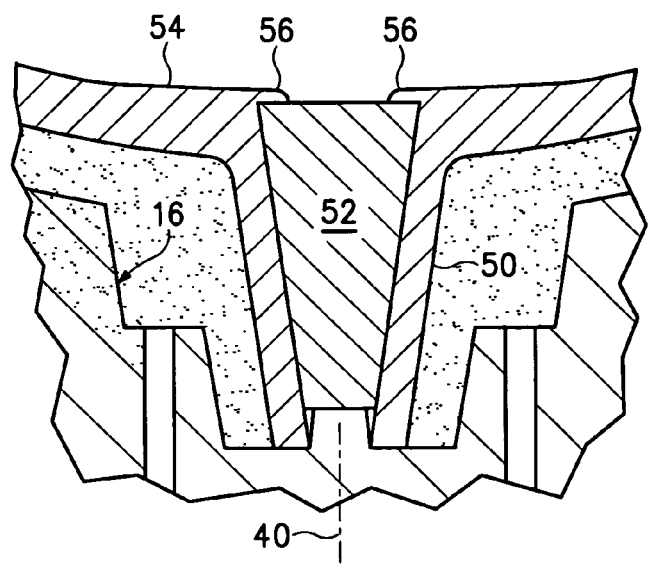
FIG. 3C is the view of FIG. 3B after additional silica grain fusion.
Figure 3D:
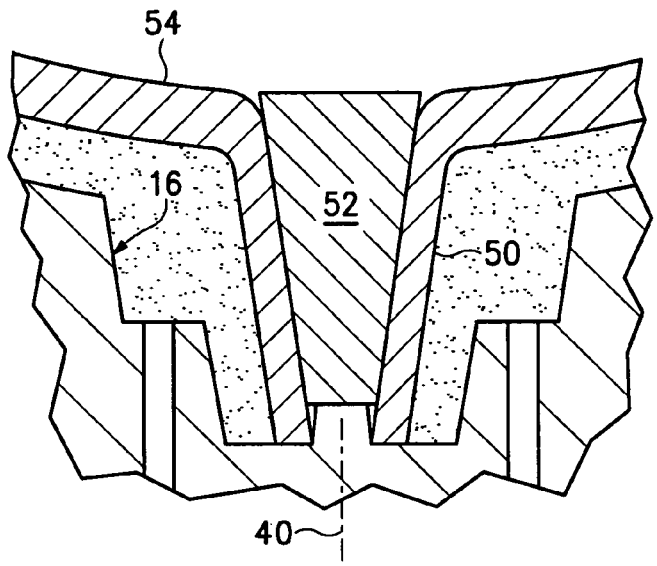
FIG. 3D is the view of FIG. 3C after still more silica fusion, and it is also an enlarged partial view of FIG. 2.

The progression of the fusion front can be observed from FIG. 3B, to FIG. 3C, to FIG. 3D, the latter depicting a substantially complete crucible. As can be seen in FIG. 3C, glass layer 56 begins to recede from the top of plug 52 until the top surface of the plug is exposed as shown in FIG. 3D. Glass layer 56 recedes as shown because the molten glass flows and also apparently because of the balance of surface tension and viscosity of molten silica. In addition, the molten silica forms around and to tube 50, which produces the structure of FIG. 3D, in which the crucible is fully fused.

As also shown in FIG. 3D, there remains silica grain between the outer surface of the crucible and mold surface 14. And there remains a substantial collar of grain around tube 50 as a result of the structure of recess 16. In other words, walls 18, 20 and floors 22, 24 are shaped to hold a substantially thicker layer of grain than, e.g., the layer that is between mold surface 14 and the outer layer of the fused crucible. This thick layer is beneficial because of the difference in the thermal expansion coefficients of silica glass and graphite. Because graphite contracts much more rapidly than silica glass as they cool, the grain acts as a cushion to absorb the pressure applied by the graphite mold as it contracts. In addition, the silica grain acts as an insulator during fusion: it insulates mold 12 from the heat of the plasma gas ball. In other words it traps the heat around tube 50 and the surrounding silica grain during fusion. This assists in forming the tube to the finished crucible as depicted in FIG. 3D.

Having the nozzle symmetrical with rotation axis 40, or parallel thereto, facilitates removing the formed crucible from the mold.

Figure 4A:
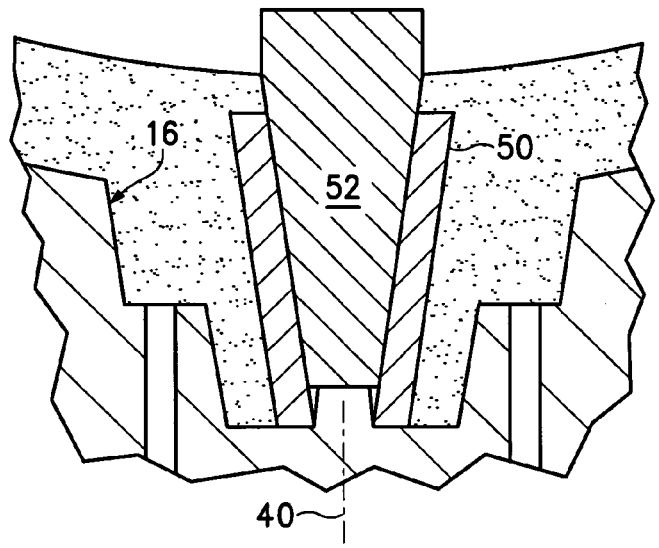
FIG. 4A is a view similar to FIG. 3A showing an alternative less preferred implementation.
Figure 4B:
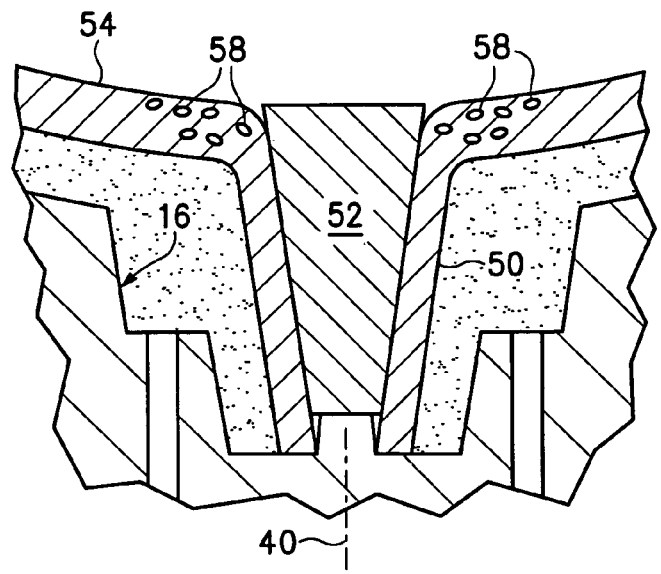
FIG. 4B is a view similar to FIG. 4A after completion of fusing the silica grain.

Turning now to FIGS. 4A and 4B, another implementation is depicted. This approach is substantially identical to that previously described except that plug 52 extends above the level of the silica grain after the grain is poured into the molds and shaped to form the crucible. This can be clearly seen in FIG. 4A.

FIG. 4B depicts the grain after the crucible is fully fused. As can be seen, there are bubbles 58 formed around the graphite plug. This results from exposure of the plug to the plasma glass ball during fusion. And, as alluded to above, formation of such bubbles is aggravated when the graphite contains impurities. Such bubbles may have a diameter of 1 mm. While these bubbles may be acceptable in some applications, they are not desirable.

In one example, a silica glass tapered nozzle 55 mm in length is created by cutting the piece from a silica glass block. A vessel having a 555 mm outer diameter and a 12 mm thick wall was formed as described above. This successfully fused the preformed nozzle to the vessel body with no cracking and without subsequent annealing. The resulting structure is used as a funnel to pour silica melt into a mold. Another vessel having a 610 mm outer diameter and 12 mm wall thickness was successfully formed in accordance with this system. It has a cylindrical nozzle having a 30 mm outer diameter, a 16 mm inner diameter, and a 65 mm length.

It should be appreciated that a solid projection could be formed onto a vessel in a similar fashion and that a cavity, rather than an opening through the wall, could also be formed using the present system.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. A method for making a fused silica crucible with a rotating mold, the method comprising:
   incorporating a glass obect having an opening therethrough into the mold symmetrical with the axis of rotation;
   rotating the mold and the object;
   forming silica grain in the rotating mold;
   covering the object with silica grain;
   heating the silica grain until the grain begins to fuse; and
   continuing heating the silica grain until an upper surface of the object is exposed.

2. The method of claim 1 wherein the method further comprises inserting a plug in one end of the opening prior to covering the object with silica grain.

3. The method of claim 2 wherein the method further comprises heating the formed silica grain until it fuses and removing the plug after it fuses.

4. The method of claim 2 wherein covering the object with silica grain further comprises covering the plug with silica grain.

5. The method of claim 4 wherein continuing heating the silica grain until an upper surface of the object is exposed further comprises heating the formed grain until an upper surface of the plug is exposed.

6. The method of claim 4 wherein covering the plug with silica grain further comprises covering the plug with a layer of silica grain in the range of 1 to 15 millimeters.

7. The method of claim 6 wherein covering the plug with silica grain further comprises covering the plug with a layer of silica grain in the range of 2 to 6 millimeters.

* * * * *

UNITED STATES PATENT AND TRADEMARK OFFICE
CERTIFICATE OF CORRECTION

PATENT NO. : 7,556,764 B2  Page 1 of 1
APPLICATION NO. : 11/271491
DATED : July 7, 2009
INVENTOR(S) : Katsuhiko Kemmochi et al.

It is certified that error appears in the above-identified patent and that said Letters Patent is hereby corrected as shown below:

At column 4, line 23, please replace "obect" with --object--

Signed and Sealed this

Eighteenth Day of August, 2009

David J. Kappos
*Director of the United States Patent and Trademark Office*